(12) United States Patent
Jindo et al.

(10) Patent No.: US 11,302,667 B2
(45) Date of Patent: Apr. 12, 2022

(54) METHOD OF VERTICALLY VIBRATING A BONDING ARM

(71) Applicant: KAIJO CORPORATION, Tokyo (JP)

(72) Inventors: Riki Jindo, Tokyo (JP); Akio Sugito, Tokyo (JP)

(73) Assignee: KAIJO CORPORATION, Tokyo (JP)

( * ) Notice: Subject to any disclaimer, the term of this patent is extended or adjusted under 35 U.S.C. 154(b) by 0 days.

(21) Appl. No.: 17/002,837

(22) Filed: Aug. 26, 2020

(65) Prior Publication Data
US 2020/0388590 A1 Dec. 10, 2020

Related U.S. Application Data

(63) Continuation of application No. 15/571,694, filed as application No. PCT/JP2015/086398 on Dec. 25, 2015, now abandoned.

(51) Int. Cl.
*H01L 23/00* (2006.01)
*B23K 20/00* (2006.01)
(Continued)

(52) U.S. Cl.
CPC ............ *H01L 24/78* (2013.01); *B23K 1/0016* (2013.01); *B23K 1/06* (2013.01); *B23K 3/063* (2013.01);
(Continued)

(58) Field of Classification Search
CPC . H01L 2224/78301; H01L 2224/78353; H01L 2224/85205; H01L 2924/00014;
(Continued)

(56) References Cited

U.S. PATENT DOCUMENTS 5,044,543 A * 9/1991 Yamazaki ............ B23K 20/005
228/110.1
5,058,797 A 10/1991 Terakado
(Continued)

FOREIGN PATENT DOCUMENTS

JP 59066135 A2 4/1984
JP 2969953 B2 11/1999
(Continued)

OTHER PUBLICATIONS

International Search Report dated Mar. 15, 2016 filed in PCT/JP2015/086398.

*Primary Examiner* — Erin B Saad
*Assistant Examiner* — Carlos J Gamino
(74) *Attorney, Agent, or Firm* — Rankin, Hill & Clark LLP

(57) ABSTRACT

To provide a wire bonding apparatus, which is insusceptible to a bonding state at a second bonding point due to a wire cut error or the like, or to members such as a capillary and a wire, and is capable of automatically protruding the wire from a leading end of the capillary, provided is a wire bonding apparatus including: a capillary (6) having a through hole through which a wire (40) is to be inserted; a holding unit, which is provided above the capillary (6), and is configured to hold the wire (40) inserted through the capillary (6); and a vibrating unit configured to vertically vibrate the capillary (6). Under a state in which the holding unit holds the wire (40), the vibrating unit vertically vibrates the capillary (6) so that the wire (40) is protruded from the leading end of the capillary.

8 Claims, 11 Drawing Sheets

(51) Int. Cl.
  *B23K 1/00* (2006.01)
  *B23K 1/06* (2006.01)
  *B23K 3/06* (2006.01)
  *B23K 3/08* (2006.01)
  *B23K 101/36* (2006.01)
  *B23K 101/42* (2006.01)

(52) U.S. Cl.
  CPC .............. *B23K 3/08* (2013.01); *B23K 20/007* (2013.01); *H01L 24/85* (2013.01); *B23K 2101/36* (2018.08); *B23K 2101/42* (2018.08); *H01L 24/45* (2013.01); *H01L 2224/45144* (2013.01); *H01L 2224/45147* (2013.01); *H01L 2224/78* (2013.01); *H01L 2224/7801* (2013.01); *H01L 2224/789* (2013.01); *H01L 2224/78268* (2013.01); *H01L 2224/78301* (2013.01); *H01L 2224/78353* (2013.01); *H01L 2224/78621* (2013.01); *H01L 2224/78901* (2013.01); *H01L 2224/78925* (2013.01); *H01L 2224/859* (2013.01); *H01L 2224/85045* (2013.01); *H01L 2224/85205* (2013.01); *H01L 2924/14* (2013.01)

(58) Field of Classification Search
  CPC . H01L 2224/45144; H01L 2224/45147; H01L 2224/78; H01L 2224/7801; H01L 2224/78268; H01L 2224/78621; H01L 2224/789; H01L 2224/78901; H01L 2224/78925; H01L 2224/85045; H01L 2224/859; H01L 24/45; H01L 24/78; H01L 24/85; H01L 2924/14; B23K 1/06; B23K 20/007; B23K 1/0016; B23K 2101/36; B23K 2101/42; B23K 3/063; B23K 3/08; B23K 20/10; B23K 20/004; B23K 20/005
  See application file for complete search history.

(56) References Cited

U.S. PATENT DOCUMENTS

| | | | |
|---|---|---|---|
| 5,176,310 A | 1/1993 | Akiyama | |
| 5,238,173 A * | 8/1993 | Ura | B23K 20/007 228/104 |
| 5,326,015 A | 7/1994 | Weaver | |
| 5,566,876 A * | 10/1996 | Nishimaki | H01L 24/78 228/102 |
| 5,699,951 A * | 12/1997 | Miyoshi | B23K 20/004 228/4.5 |
| 5,791,550 A * | 8/1998 | Kobayashi | H01L 24/85 228/180.5 |
| 5,897,049 A | 4/1999 | Nakamura | |
| 5,968,282 A * | 10/1999 | Yamasaka | B08B 1/00 134/6 |
| 6,056,627 A * | 5/2000 | Mizuta | G01R 3/00 451/533 |
| 7,391,104 B1 | 6/2008 | Chang | |
| 8,302,841 B2 | 11/2012 | Qin | |
| 8,919,632 B2 | 12/2014 | Liu | |
| 9,825,000 B1 | 11/2017 | Alan et al. | |
| 10,792,713 B1 * | 10/2020 | Humphrey | B65G 45/10 |
| 2001/0004991 A1 | 6/2001 | Mochida | |
| 2002/0096187 A1 | 7/2002 | Kuwata | |
| 2004/0083568 A1 * | 5/2004 | Morioka | B24D 15/04 15/118 |
| 2004/0096643 A1 * | 5/2004 | Sato | B08B 1/00 428/308.4 |
| 2006/0289605 A1 | 12/2006 | Park | |
| 2007/0187138 A1 | 8/2007 | Suzuki | |
| 2008/0070481 A1 * | 3/2008 | Tamura | B08B 1/00 451/28 |
| 2010/0132736 A1 * | 6/2010 | Lin | B08B 7/0028 134/6 |
| 2011/0132396 A1 * | 6/2011 | Humphrey | B24D 11/005 134/6 |
| 2011/0155789 A1 * | 6/2011 | Aoyagi | H01L 24/85 228/1.1 |
| 2011/0278349 A1 | 11/2011 | Tei | |
| 2013/0056025 A1 * | 3/2013 | Widhalm | B08B 1/00 134/6 |
| 2013/0256385 A1 | 10/2013 | Sugito | |
| 2014/0305996 A1 * | 10/2014 | Takanami | H01L 24/78 228/1.1 |
| 2019/0237427 A1 | 8/2019 | Klaerner | |

FOREIGN PATENT DOCUMENTS

| | | |
|---|---|---|
| JP | 4467631 B1 | 5/2010 |
| JP | 2010161176 A2 | 7/2010 |
| JP | 2010161377 A2 | 7/2010 |
| JP | 2011066278 A2 | 3/2011 |
| JP | 2014107561 A2 | 6/2014 |
| KR | 101312148 B1 | 9/2013 |

* cited by examiner

FIG. 5A  FIG. 5B  FIG. 5C  FIG. 5F
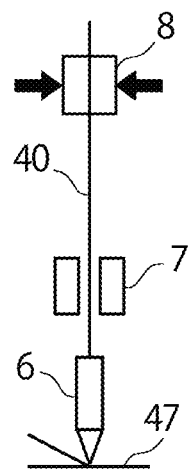
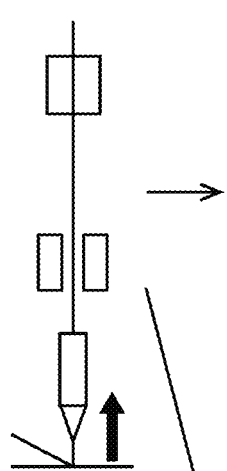
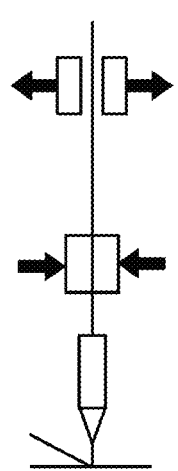
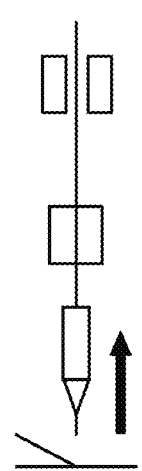
FIG. 5D  FIG. 5E
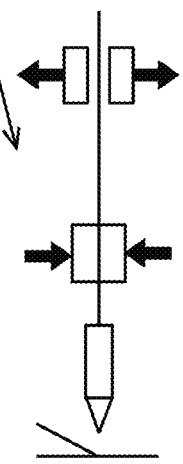
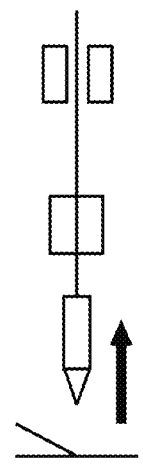

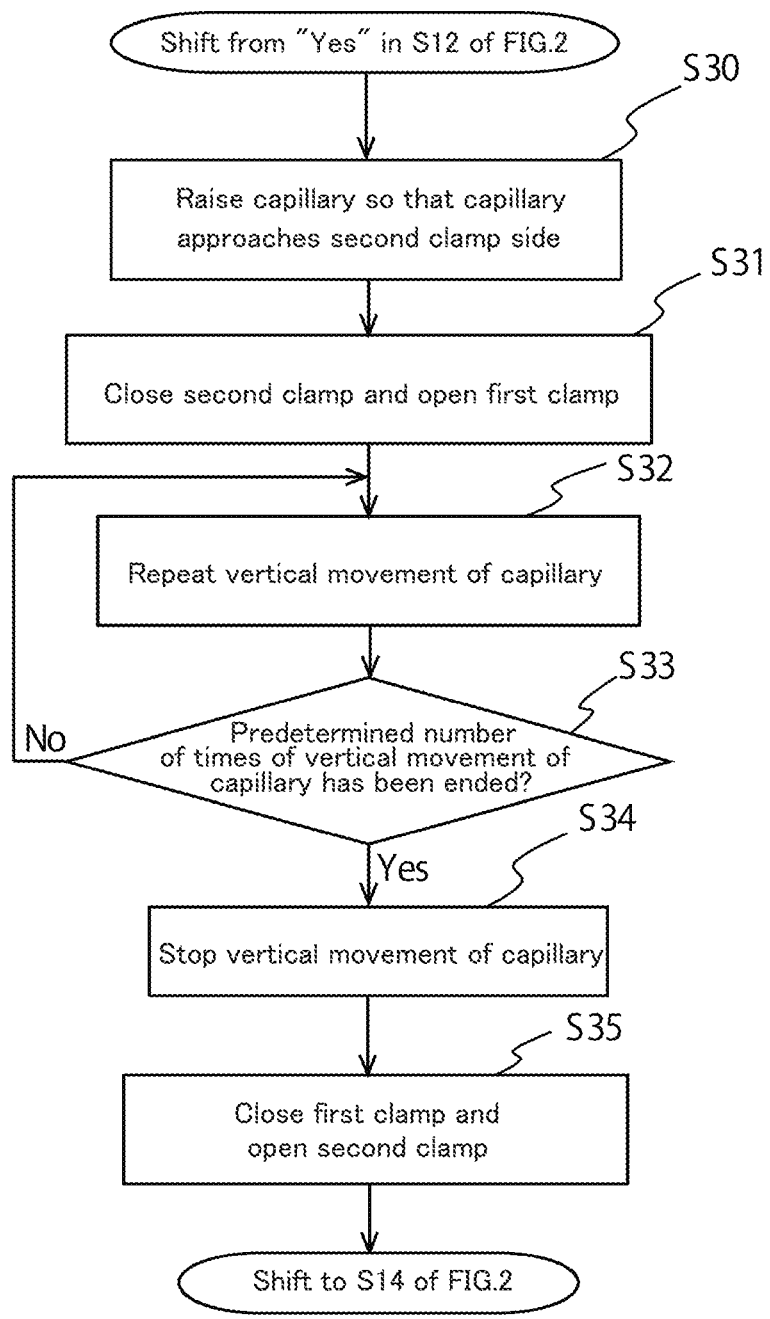

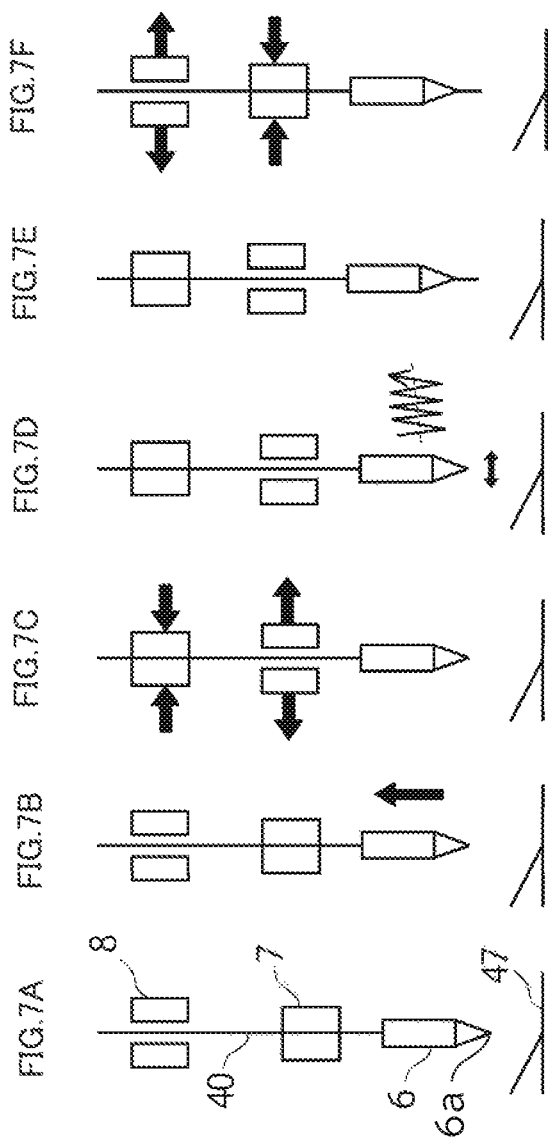

METHOD OF VERTICALLY VIBRATING A BONDING ARM

BACKGROUND OF THE INVENTION

1. Field of the Invention

The present invention relates to a wire bonding apparatus configured to connect an electrode of a component to be bonded and a lead to each other with use of a wire, and more particularly, to a wire bonding apparatus capable of automatically protruding a wire from a leading end of a capillary.

2. Description of the Related Art

Hitherto, there has been used a wire bonding apparatus configured to connect an electrode (pad) on an IC chip, which serves as a first bonding point, and a lead, which serves as a second bonding point, to each other with use of a wire made of gold, copper, or other materials.

In a wire bonding apparatus configured to bond a pad of an IC chip, which serves as the first bonding point, and as the second bonding point, for example, a lead of a lead frame made of a metal to each other with use of a wire, the bonding property between the surface of the lead and the wire at the second bonding point may be insufficient in some cases, and thus bonding failure or fall-out of the wire may be caused.

Therefore, in Japanese Patent No. 4467631 and Japanese Patent Application Laid-open No. 2010-161377, there is disclosed a wire bonding apparatus capable of suppressing fall-out and bending of the wire. In Japanese Patent No. 4467631 and Japanese Patent Application Laid-open No. 2010-161377, the wire bonding apparatus includes wire cutting means for cutting a wire by bonding the wire using a capillary, and then raising the capillary and a first clamper while the first clamper remains closed, and wire extending means for extending a tail wire from a leading end of the capillary by raising the capillary, and then raising the capillary and the first clamper under a state in which the first clamper is opened and a second clamper is closed.

Further, in Japanese Patent Application Laid-open No. 2011-66278, there is disclosed a bonding apparatus having a wire feed-out step after a capillary cleaning step. In Japanese Patent Application Laid-open No. 2011-66278, the bonding apparatus includes wire pull-in means for pulling a leading end of the wire into a wire insertion hole of the capillary by a predetermined length from a leading end of the capillary by lowering the capillary under a state in which the second clamper is closed and the first clamper is opened, cleaning means for removing dirt on the leading end of the capillary by pressing the leading end of the capillary against a cleaning sheet, wire bending correcting means for correcting the bending of the leading end of the wire by subjecting the capillary to ultrasonic vibration under a state in which the second clamper is closed and the first clamper is opened, and wire feed-out means for feeding out the wire to the leading end of the capillary by operating the first clamper and the second clamper so as to open or close in conjunction with the vertical operation of the capillary.

Further, in Korean Patent No. 10-1312148, there is disclosed a method of cleaning a capillary of a wire bonder. In Korean Patent No. 10-1312148, it is determined whether or not the bonding has been performed a defined number of times or more, and when the bonding has been performed the defined number of times or more, the wire is cut after the second bonding, and the wire is pulled into the capillary by an air tension.

Then, the clamper is closed and lowered in the Z axis so that the lower surface of the capillary is cleaned on a cleaning tape. At the time of cleaning, vibration (biaxial horizontal movement) is performed through ultrasonic vibration and a reciprocating operation obtained by an XY stage.

When the wire is to be fed out after the cleaning, the air of the air tension is blown downward to feed out the wire. At this time, the capillary is subjected to ultrasonic vibration to facilitate the feed-out of the wire.

A ball is formed by sparking at the leading end of the wire fed out from the capillary, and dummy bonding is performed on a substrate prepared separately. An operator checks whether or not there is an abnormality, and then a normal bonding operation is performed.

However, in Japanese Patent No. 4467631 and Japanese Patent Application Laid-open No. 2010-161377, depending on the bonding state at the second bonding point, for example, the cut wire may adhere to the inside of the leading end of the capillary or the wire may strongly bite into the edge inside the capillary, and thus a wire for forming a tail may fail to be protruded (fed out). In particular, when the leading end of the capillary has a small inner diameter, this phenomenon becomes conspicuous.

Further, the capillary is raised in order to form a tail of the wire, but when the wire located below the second clamper is buckled, the wire may fail to be protruded. In particular, when the wire has a small diameter, this phenomenon becomes conspicuous.

Meanwhile, as disclosed in Japanese Patent Application Laid-open No. 2011-66278, the wire is fed out of the capillary by simply raising the capillary while applying ultrasonic vibration to the capillary, but the distance between the capillary and the second clamper is long, and hence the wire is easily buckled. Thus, the wire may fail to be protruded from the capillary.

Further, regarding the feed-out of the wire in the capillary with use of air, which is disclosed in Korean Patent No. 10-1312148, the wire located on the lower side of the air tension may be buckled. Therefore, it may be difficult to pull out the wire from the capillary only by the wind pressure of the air. Further, the wire protrusion operation with use of air requires time for starting the operation because the response time of the air tension is decreased due to pipes for the air or other factors. Therefore, the wire bonder may fail to perform high-speed operation.

Further, the buckling of the wire may be corrected by applying ultrasonic vibration for reducing friction between the wire and the capillary, or applying a reciprocating operation in XY directions to the capillary, the clamper, and the wire.

However, when the wire adheres to the inside of the leading end of the capillary, the ultrasonic vibration or the reciprocating operation in the XY directions cannot apply a force necessary for separating the wire from the capillary, and hence the wire may fail to be protruded from the capillary.

Therefore, it has been demanded that the wire be automatically and stably protruded from the leading end of the capillary without being affected by the bonding state at the second bonding point or members such as the capillary and the wire.

Further, regarding the capillary cleaning disclosed in Japanese Patent Application Laid-open No. 2011-66278 and Korean Patent No. 10-1312148, when the capillary is cleaned only by the ultrasonic vibration, the vibration width of the capillary is small, and hence a force for peeling off deposited matters on the leading end of the capillary may not be sufficiently obtained. Further, the vibration width of the capillary can be increased by performing the reciprocating operation of the XY stage, but the reciprocating operation of the XY stage is a movement at the same position, and hence the wearing of the cleaning sheet easily progresses. Thus, a sufficient cleaning effect may not be obtained.

SUMMARY OF THE INVENTION

In view of the above, the present invention has an object to provide a wire bonding apparatus, which is insusceptible to a bonding state at a second bonding point due to a wire cut error or the like, or to members such as a capillary and a wire, is capable of automatically protruding the wire from a leading end of the capillary, is capable of reliably cleaning the capillary during bonding and protruding the wire after the capillary is cleaned, and is capable of significantly improving an operating rate.

In order to achieve the above-mentioned object, according to one embodiment of the present invention, there is provided a wire bonding apparatus including: a capillary having a through hole through which a wire is to be inserted; holding means, which is provided above the capillary, for holding the wire inserted through the capillary; and vibrating means for vertically vibrating the capillary, in which, under a state in which the holding means holds the wire, the vibrating means vertically vibrates the capillary so that the wire is protruded from a leading end of the capillary.

Further, the vibrating means of the one embodiment of the present invention is configured to vertically vibrate a bonding arm, which has a leading end to which the capillary is mounted through intermediation of an ultrasonic horn, at a frequency including a natural frequency of the bonding arm.

Further, the wire bonding apparatus according to the one embodiment of the present invention further includes capillary moving means for vertically moving the capillary, and the capillary is vertically vibrated after the capillary is moved for a predetermined distance to approach the holding means.

Further, in the wire bonding apparatus according to the one embodiment of the present invention, the capillary is vertically vibrated while the capillary is raised by the capillary moving means so as to approach the holding means.

Further, the wire bonding apparatus according to the one embodiment of the present invention further includes ultrasonic applying means for applying ultrasonic vibration to the capillary, and the ultrasonic vibration is superimposed to the capillary when the capillary is vertically vibrated.

Further, the wire bonding apparatus according to the one embodiment of the present invention further includes a wire protrusion amount measuring means for measuring a protrusion amount of the wire from the leading end of the capillary, and the capillary is vertically vibrated based on a measurement result obtained by the wire protrusion amount measuring means.

Further, the wire protrusion amount measuring means of the one embodiment of the present invention includes: a capillary height detection unit configured to detect a capillary height; a measurement member made of a conductive material; and a contact detection unit configured to detect contact between the measurement member and one of the leading end of the capillary and a leading end of the wire protruding from the leading end of the capillary based on a conductive state therebetween, and the protrusion amount of the wire is calculated based on a difference between a capillary height obtained when the leading end of the capillary in a state in which the wire is not protruded from the leading end is in contact with the measurement member and a capillary height obtained when the leading end of the wire protruding from the leading end of the capillary is in contact with the measurement member.

Further, the wire bonding apparatus according to the one embodiment of the present invention further includes a wire protrusion state detecting means including: a capillary height detection unit configured to detect a capillary height; and a conductive state detection unit configured to detect a conductive state between the wire and a bonding point at which the wire is bonded, the wire protrusion state detecting means is configured to detect a protrusion state of the wire from the leading end of the capillary based on the capillary height at which the conductive state has changed while the capillary, which has bonded the wire to the bonding point, is raised, and the capillary is vertically vibrated based on the protrusion state of the wire.

Further, the wire bonding apparatus according to the one embodiment of the present invention further includes a cleaning sheet having an adhesive property, and the vibrating means is configured to vertically vibrate the capillary so that the leading end of the capillary repeatedly abuts against a surface of the cleaning sheet, to thereby perform cleaning of removing dirt adhering to the leading end of the capillary.

Further, the cleaning sheet of the one embodiment of the present invention is obtained by forming an abrasive layer made of an abrasive on a cushioning layer having protrusions.

Further, in the wire bonding apparatus according to the one embodiment of the present invention, the capillary is vertically vibrated after the capillary is cleaned with use of the cleaning sheet.

Hitherto, when errors such as a wire cut error occur after second bonding, the wire bonding apparatus is stopped, and an operator is required to carry out a work of inserting the wire through the capillary again. The wire bonding apparatus according to the one embodiment of the present invention includes the vibrating means for vertically vibrating the capillary, and determines whether or not the wire is protruded from the leading end of the capillary while the capillary is raised after the second bonding. When it is determined that the wire is not protruded from the leading end of the capillary, the vibrating means causes the wire to protrude from the leading end of the capillary.

In this manner, even under a state in which the wire adheres to the leading end of the capillary during the bonding, or the wire is caught to the inside of the capillary, the wire can be automatically protruded from the leading end of the capillary without stopping the wire bonding apparatus. Therefore, the operating rate of the wire bonding apparatus can be improved.

Further, according to the present invention, whether or not a predetermined length of wire is protruded from the leading end of the capillary can be automatically detected before or after the wire is protruded, and hence the operation of checking the wire protrusion by the operator is unnecessary.

Further, hitherto, when the apparatus is started up or when the wire cut error occurs, after the wire is inserted through the capillary, the wire is required to be protruded from the leading end of the capillary by a length necessary for forming a ball. At this time, a capillary dent is formed once or twice on a bonding workpiece so that the wire is cut and a necessary amount of wire tail is ensured. Therefore, the wire remaining on the workpiece is required to be removed.

In the wire bonding apparatus according to the one embodiment of the present invention, after the wire is inserted through the capillary and the wire is cut at the leading end of the capillary, the wire can be automatically protruded from the leading end of the capillary. Therefore, the wire can be easily protruded without forming an unnecessary dent on the bonding workpiece. Further, the wire bonding apparatus can be operated with a minimum wire consumption amount.

Further, in the wire bonding apparatus, deposited matters adhere to the leading end of the capillary during the bonding, and thus the protrusion of the wire is inhibited. Therefore, cleaning of the capillary is required. The wire bonding apparatus according to the one embodiment of the present invention cleans the capillary by vertically moving the leading end of the capillary at high speed so that the leading end repeatedly abuts against the surface of the cleaning sheet having an adhesive property. In this manner, the deposited matters on the leading end of the capillary and the dirt adhering to the inside of the capillary can be peeled off. Therefore, after the capillary is cleaned, the wire can be smoothly protruded.

Further, cleaning the leading end of the capillary enables the usage period of the capillary to be extended. Further, the number of times of replacement of the capillary can be reduced, and hence the time required for the replacement of the capillary can be reduced. Thus, the operating rate of the wire bonding apparatus can be improved, and the cost of the bonding components can be reduced.

Further, in the present invention, the capillary cleaning and the protrusion (wire tail formation) operation of the wire at the leading end of the capillary are automatically performed, and thus the wire bonding apparatus can be operated without a stop. Therefore, the continuous operating time may be significantly improved.

BRIEF DESCRIPTION OF THE DRAWINGS

FIG. 5A, FIG. 5B, FIG. 5C, FIG. 5D, FIG. 5E, and FIG. 5F are diagrams for illustrating operations of the capillary, the first clamp, and the second clamp in the wire protrusion state detection operation illustrated in FIG. 4.

FIG. 6 is a flow chart for illustrating a wire protrusion operation performed after an error occurs in the wire bonding.

FIG. 7A, FIG. 7B, FIG. 7C, FIG. 7D, FIG. 7E, and FIG. 7F are diagrams for illustrating operations of the capillary, the first clamp, and the second clamp in the wire protrusion operation illustrated in FIG. 6.

DESCRIPTION OF THE EMBODIMENTS

Now, with reference to the drawings, a wire bonding apparatus according to an embodiment of the present invention is described. According to the present invention, a wire can be automatically protruded from a leading end of a capillary without being affected by a bonding state at a second bonding point or members such as the capillary and the wire. Further, cleaning of removing dirt on the capillary during bonding and protrusion of the wire after the capillary is cleaned can be reliably performed. Thus, an operating rate of the wire bonding apparatus is significantly improved.

[Configuration of Wire Bonding Apparatus]

Figure 1:
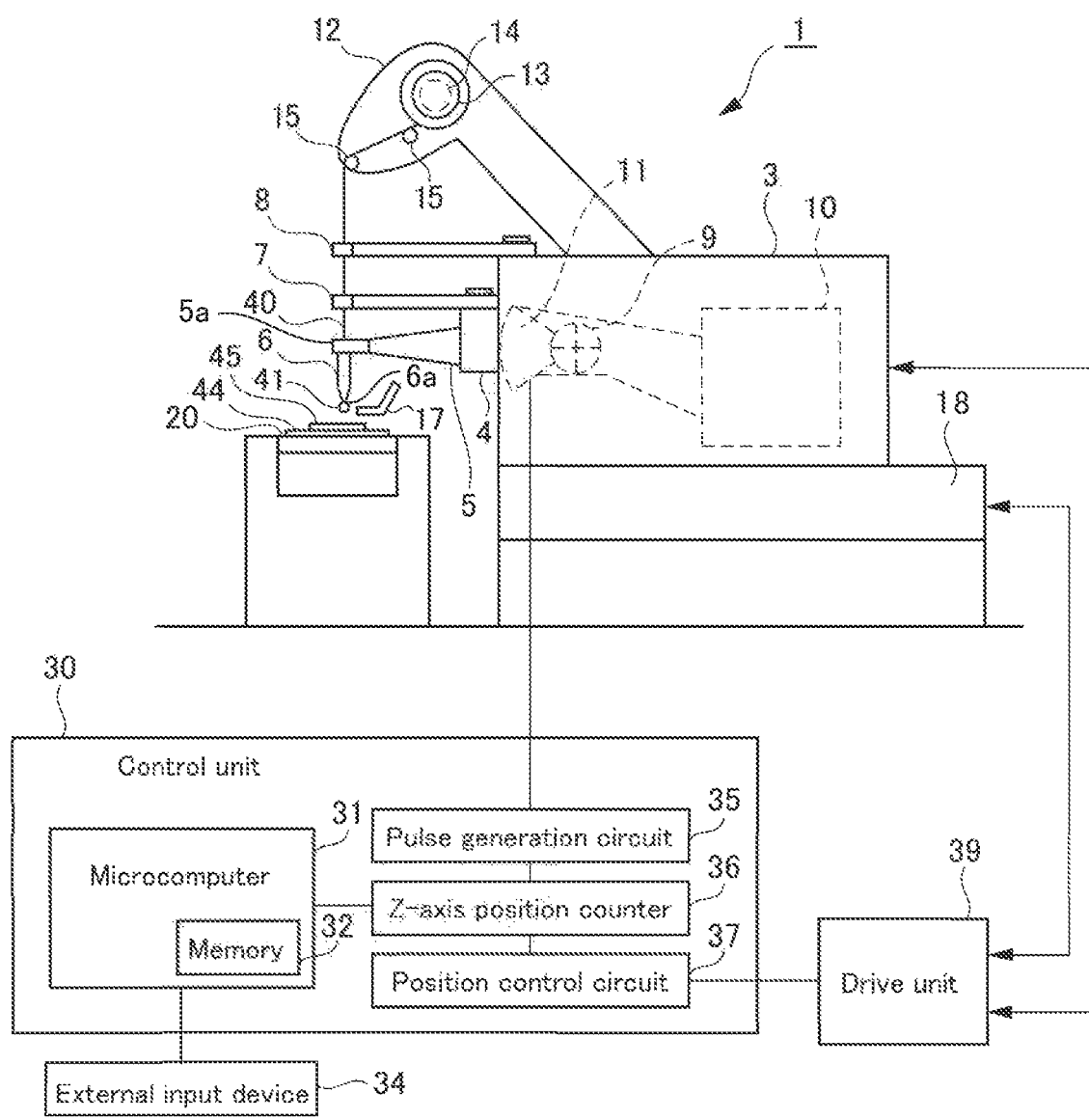
FIG. 1 is a diagram for illustrating a configuration of a wire bonding apparatus of the present invention.

FIG. 1 is a diagram for illustrating a configuration of the wire bonding apparatus of the present invention. As illustrated in FIG. 1, a wire bonding apparatus 1 includes a bonding head 3, an XY stage 18 serving as positioning means, on which the bonding head 3 is mounted, for positioning the bonding head 3 by two-dimensionally moving the bonding head 3 in an X direction and/or a Y direction, a bonding stage 20 on which a lead frame 44 having an IC chip 45 or other components mounted thereon is mounted so that a bonding work may be performed by a bonding tool 6, a control unit 30 including a microcomputer 31, and a drive unit 39 configured to output a drive signal to respective motors of the bonding head 3 and the XY stage 18 in accordance with a command signal from a position control circuit 37.

The bonding head 3 includes an ultrasonic horn 5 including an ultrasonic transducer (not shown) and a capillary 6 serving as the bonding tool 6 mounted to a leading end 5a of the ultrasonic horn 5, a bonding arm 4 including the ultrasonic horn 5 at one leading end thereof and having the other end coupled to a support shaft 9, an encoder 11 serving as position detecting means for detecting the position of the capillary 6 mounted to the leading end of the bonding arm 4, and a linear motor 10 configured to vertically drive the bonding arm 4 about the support shaft 9. A motor for driving the bonding arm 4 is not limited to the linear motor 10, and other types of motor may be used.

Further, as illustrated in FIG. 1, the bonding head 3 includes a first clamp 7, which is configured to hold a wire 40 by an opening/closing mechanism, and is fixed to the bonding arm 4 to vertically move in association with the capillary 6. Further, the bonding head 3 includes a second clamp 8 (holding means), which is configured to hold the wire 40 extending in a perpendicular direction through intermediation of the capillary 6 and the first clamp 7, and is located above the first clamp 7. The second clamp 8 is fixed to the bonding head 3 and does not move in association with the capillary 6 unlike the first clamp 7. The opening/closing mechanism of the first clamp 7 and the second clamp 8 configured to hold the wire 40 is controlled by the control unit 30 via the drive unit 39.

Further, the bonding head 3 includes a wire supply mechanism 12 configured to supply the wire. As illustrated in FIG. 1, the wire supply mechanism 12 includes a wire spool 13 around which the wire is wound, a feeding motor 14 configured to rotate the wire spool 13 to feed out the wire, and wire guides 15 configured to guide the fed wire to the second clamp 8. The wire supply mechanism 12 includes a wire supply sensor (not shown) configured to detect a loosened state of the wire between the wire guides 15, and the wire supply is controlled based on the signal from the wire supply sensor. When the wire is to be fed out from the wire spool 13, the feeding motor 14 is rotated by the drive unit 39.

Further, the bonding head 3 includes a discharge electrode 17 for forming a ball 41 in the wire 40 at the leading end 6a of the capillary 6. A high-voltage generating apparatus (not shown) configured to generate a high voltage is connected between the discharge electrode 17 and the first clamp 7 configured to hold the wire. The high-voltage generating apparatus generates a high voltage at a predetermined timing to form the ball 41 at the leading end 6a of the capillary 6.

Further, the wire bonding apparatus 1 includes a workpiece conveyance unit (not shown) configured to convey and position a workpiece, for example, a lead frame, on the bonding stage 20. In the following description, the workpiece conveyance unit includes the bonding stage 20.

Further, the wire bonding apparatus 1 includes a conductive state verification circuit (not shown) configured to verify a conductive state by applying a current between a lead of the lead frame 44 and a distal end of the wire in the wire spool 13. The conductive state verification circuit is configured to apply a DC voltage between the distal end of the wire and the workpiece conveyance unit having the lead frame 44 mounted thereon through intermediation of a resistor, to thereby verify the conductive state between the distal end of the wire and the lead based on a value of the voltage generated through the resistor when the DC voltage is applied. The lead of the lead frame 44 and the workpiece conveyance unit are configured to achieve a conductive state. The conductive state verification circuit is used for a wire protrusion state detection operation and a wire protrusion amount measurement operation, which are described later.

As illustrated in FIG. 1, the control unit 30 has built therein the microcomputer 31 including a CPU (not shown), a memory 32, and an input/output unit (not shown), and the CPU of the microcomputer 31 executes a program stored in the memory 32 to control the wire bonding apparatus 1. The memory 32 of the microcomputer 31 can store data or the like in addition to the program.

Further, the microcomputer 31 is connected to an external input device 34, for example, a keyboard. Data and the like such as the amount and the number of times of the vertical movement of the capillary 6, which are input via the external input device 34, are stored in the memory 32.

The position of the capillary 6 in the bonding is represented by a distance from an origin position of the capillary 6 in a Z-axis (perpendicular) direction. The origin position of the capillary 6 refers to a position of the capillary 6 when the encoder 11 detects the origin. For example, the position of the capillary 6 when the ball 41 located at the leading end of the capillary 6 abuts against a bonding point corresponds to a distance in the perpendicular direction from the origin position of the capillary 6 at the time of abutment. The origin position of the capillary 6 is set in advance.

The distance or the like until the lowered capillary 6 abuts against the bonding point is detected by counting the signal output from the encoder 11 configured to detect the position of the capillary 6. The signal output from the encoder 11 is input to a pulse generation circuit 35. The pulse generation circuit 35 is configured to count the signal of the encoder 11 to output a direction and an amount of the vertical movement of the capillary 6 by means of pulse to a Z-axis position counter 36.

The Z-axis position counter 36 is configured to count the pulse output from the pulse generation circuit 35 to measure the movement amount of the capillary 6 from the origin. The microcomputer 31 can read out the data of the Z-axis position counter 36. Through read-out of the data of the Z-axis position counter 36, the position in the Z-axis (perpendicular) direction from the origin position of the capillary 6, that is, the movement amount of the capillary 6 can be known. The position detecting means for detecting the position of the capillary 6 includes the encoder 11, the pulse generation circuit 35, and the Z-axis position counter 36.

Regarding the position of the capillary 6, in the following description, a spark height refers to a position of the capillary 6 when discharge is performed from the discharge electrode 17 to the wire 40 at the leading end of the capillary 6, and a feed height refers to a position of the capillary 6 for protruding a necessary amount of the wire 40 from the leading end of the capillary 6. Further, a capillary height refers to a current position of the capillary 6, and a distance from the origin.

Further, the wire bonding apparatus 1 according to the present invention includes vibrating means for vertically vibrating the capillary 6. The vibrating means is a motor such as the linear motor 10 of the bonding head 3, which is driven by a current applied with a frequency of about several KHz to drive the linear motor 10, to thereby vibrate the capillary 6 in the vertical direction in a movement amount of several tens of micrometers ($\mu$m).

The ultrasonic transducer is used to obtain ultrasonic vibration for vibrating the capillary 6 mounted to the leading end of the ultrasonic horn 5 in a horizontal direction. Meanwhile, the vibrating means vibrates the capillary 6 in the vertical direction.

[Operation of Wire Bonding]

Figure 2:
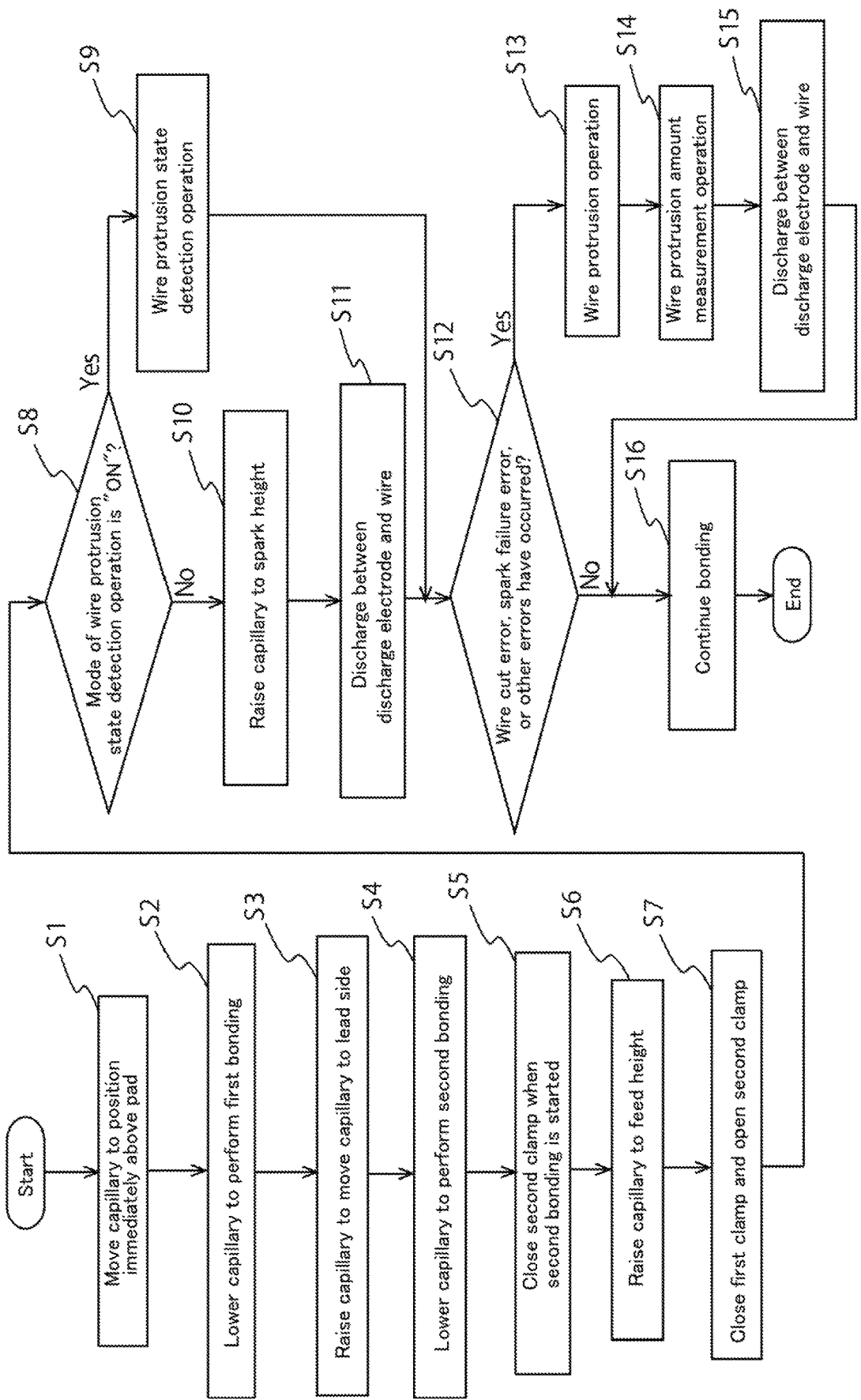
FIG. 2 is a flow chart for illustrating an operation of wire bonding in the wire bonding apparatus of the present invention.

Now, the operation of the wire bonding in the wire bonding apparatus according to the present invention is described with reference to FIG. 1, FIG. 2, and FIG. 3A to FIG. 3E. FIG. 2 is a flow chart for illustrating the operation of wire bonding in the wire bonding apparatus of the present invention. FIG. 3A to FIG. 3E are diagrams for illustrating operations of the capillary, the first clamp, and the second clamp, which are performed after second bonding in the operation of the wire bonding illustrated in FIG. 2. Bonding between the ball and a pad at a first bonding point is referred to as first bonding, and bonding between the wire and the lead at a second bonding point is referred to as second bonding.

When the wire bonding apparatus performs wire bonding between the lead and the pad on the IC chip 45, first, the capillary 6 having the wire 40 inserted therethrough and having the ball 41 formed at the leading end thereof is moved to a position immediately above the pad through the operation of the XY stage 18 (Step S1 illustrated in FIG. 2). After that, the bonding arm 4 is swung downward so that the capillary 6 is lowered to crush the ball 41 onto the pad on the IC chip 45. Thus, the first bonding is performed (Step S2). At this time, the ultrasonic horn 5 excites the capillary 6.

After the first bonding, the bonding arm 4 is raised so that the wire 40 is pulled out from the leading end of the capillary 6, and is moved to a lead 47 side in accordance with predetermined loop control (Step S3). Then, the capillary 6 is lowered to perform the second bonding (Step S4).

Figure 3A:
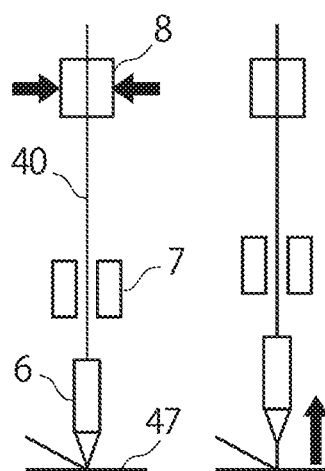
FIG. 3A, FIG. 3B, FIG. 3C, FIG. 3D, and FIG. 3E are diagrams for illustrating operations of a capillary, a first clamp, and a second clamp, which are performed after second bonding in the operation of the wire bonding illustrated in FIG. 2.
Figure 3B:
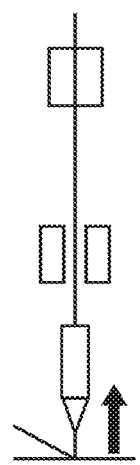

As illustrated in FIG. 3A, when the second bonding is started, the second clamp 8 is closed (Step S5). After the second bonding is ended, as illustrated in FIG. 3B, the capillary 6 is raised to the feed height. At this time, the first clamp 7 is in an opened state (Step S6).

Figure 3C:
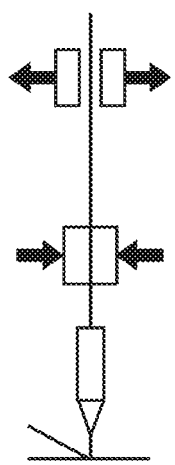

As illustrated in FIG. 3C, when the capillary 6 reaches the feed height, the first clamp 7 is closed, and the second clamp 8 is opened (Step S7).

Next, the microcomputer 31 of the control unit 30 checks whether or not the mode of the wire protrusion state detection operation set in advance in the memory 32 is "ON" (Step S8). That is, the microcomputer 31 verifies whether or not to execute the wire protrusion state detection operation for checking whether or not a predetermined wire protrusion amount is formed at the leading end of the capillary 6. When the mode of the wire protrusion state detection operation is "ON" (Yes in Step S8), the wire protrusion state detection operation is performed (Step S9). Details of the wire protrusion state detection operation are described later.

Figure 3D:
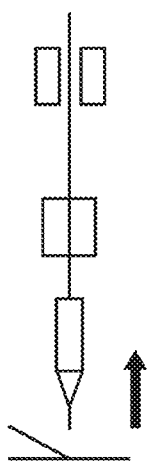

When the mode of the wire protrusion state detection operation is "OFF" (No in Step S8), as illustrated in FIG. 3D, the capillary 6 is raised to the spark height (Step S10). When the mode of the wire protrusion state detection operation is "OFF" (No in Step S8), the wire protrusion state detection operation is not performed during a period from after the second bonding to immediately before the discharge, and an error does not occur.

Figure 3E:
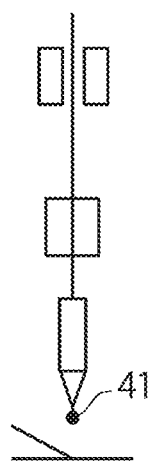

After the capillary 6 is raised to the spark height, discharge is performed between the discharge electrode 17 and the wire (Step S11). Thus, as illustrated in FIG. 3E, the ball 41 is formed at the leading end of the capillary 6.

Next, whether or not a spark failure error or other errors have occurred due to the discharge or the like is checked (Step S12). That is, when the mode of the wire protrusion state detection operation is "ON", during a period from after the second bonding to the discharge in the bonding operation, the wire bonding apparatus checks whether or not a predetermined wire protrusion amount is formed at the leading end of the capillary 6. When a predetermined wire protrusion amount is not formed at the leading end of the capillary 6, a wire cut error or the like occurs.

Further, when an abnormal discharge occurs between the discharge electrode 17 and the leading end of the wire 40, the spark failure error or the like occurs. In Step S12, whether or not errors such as the wire cut error and the spark failure error have occurred is checked.

When errors such as the spark failure error have occurred (Yes in Step S12), a wire protrusion operation, which is an operation of protruding the wire from the leading end of the capillary 6, is performed (Step S13). After that, a wire protrusion amount measurement operation of measuring whether or not the wire is protruded by a predetermined length from the leading end of the capillary is performed (Step S14). After the wire is protruded from the leading end of the capillary 6, discharge is performed between the discharge electrode 17 and the wire (Step S15) so that the ball is formed at the leading end of the capillary 6. Then, the processing shifts to Step S16 to continue the bonding. Details of the wire protrusion operation and the wire protrusion amount measurement operation are described later.

On the other hand, when it is determined that the wire is normally protruded from the leading end of the capillary 6 (No in Step S12), the bonding is continued (Step S16).

As described above, in the normal bonding, after the second bonding, the capillary 6 is raised to the feed height, and the first clamp 7 is closed under a state in which the wire 40 is pulled out by a predetermined feeding amount from the leading end of the capillary 6. Under this state, the capillary 6 is further raised to the spark height. The wire 40 is cut during this process. After that, the ball 41 is formed at the leading end of the wire 40 through discharge with use of the discharge electrode 17 at the spark height. After the ball 41 is formed, the first clamp 7 is set to the opened state and the second clamp 8 is set to the closed state. Wire bonding is performed by the above-mentioned series of steps.

Then, the above-mentioned series of operations are repeated for a plurality of pads formed on the IC chip 45 and the respective leads 47 arranged so as to correspond to those pads. Thus, the bonding for the IC chip 45 is completed.

In the related-art wire bonding apparatus, when the wire cut error, the spark failure error, or other errors occur, the bonding operation is stopped. An alarm is output after the bonding operation is stopped to notify the operator of the error. Then, the operator performs the processing for the errors to restart the bonding operation.

Therefore, when the wire cut error, the spark failure error, or other errors occur, the bonding operation is stopped, and hence the operating rate of the wire bonding apparatus is decreased.

In view of this, in the wire bonding apparatus of the present invention, even when the wire cut error, the spark failure error, or other errors occur, the wire is automatically protruded from the leading end of the capillary 6. Thus, the bonding can be continuously performed without stopping the bonding operation.

Now, details of the wire protrusion state detection operation, the wire protrusion operation, and the wire protrusion amount measurement operation illustrated in FIG. 2 are described.

[Wire Protrusion State Detection Operation]

Figure 4:
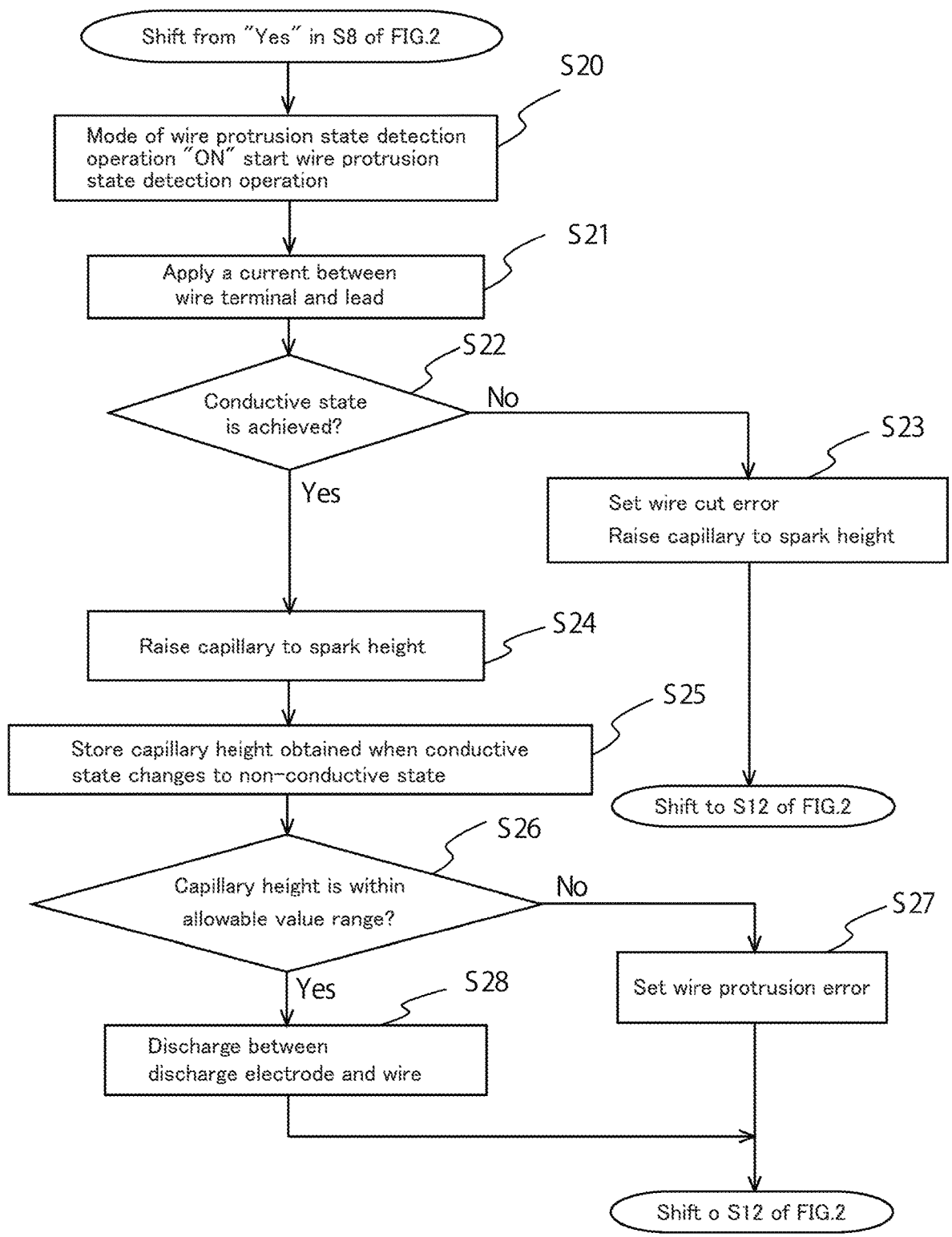
FIG. 4 is a flowchart for illustrating a wire protrusion state detection operation performed after the second bonding during the bonding.

First, the wire protrusion state detection operation performed after the second bonding in the bonding illustrated in FIG. 2 is described with reference to the flow chart of FIG. 4 and FIG. 5A to FIG. 5F. FIG. 4 is a flow chart for illustrating the wire protrusion state detection operation performed after the second bonding during the bonding. FIG. 5A to FIG. 5F are diagrams for illustrating operations of the capillary, the first clamp, and the second clamp in the wire protrusion state detection operation illustrated in FIG. 4.

The wire protrusion state detection operation is an operation of applying a current between the wire terminal and the lead 47 to verify the conductive state between the wire and the lead, to thereby detect whether or not the wire is protruded by a predetermined length from the leading end of the capillary 6.

In the following description of the wire protrusion state detection operation, an operation after the second bonding in the wire bonding is described. When the second bonding is started, as illustrated in FIG. 5A, the microcomputer 31 of the control unit 30 closes the second clamp 8 (the same as Step S5 illustrated in FIG. 2). After the second clamp 8 is closed, as illustrated in FIG. 5B, the capillary 6 is raised to the feed height. At this time, the first clamp 7 is in an opened state (the same as Step S6 illustrated in FIG. 2).

As illustrated in FIG. 5C, when the capillary 6 reaches the feed height, the first clamp 7 is closed, and the second clamp 8 is opened (the same as Step S7 illustrated in FIG. 2). After that, when the mode of the wire protrusion state detection operation is "ON" in Step S8 illustrated in FIG. 2, the wire protrusion state detection operation is performed (Step S20 illustrated in FIG. 4).

The wire protrusion state detection operation is an operation in which the conductive state verification circuit applies a current between the wire terminal (referring to the distal end of the wire) and the lead 47 (Step S21), to thereby verify the conductive state between the wire and the lead (Step S22). At this time, in a normal bonding state, the conductive state is achieved between the wire terminal and the lead 47 through intermediation of the wire 40 (Yes in Step S22). FIG. 5C is an illustration representing that the conductive state is achieved between the wire terminal and the lead 47 through intermediation of the wire 40.

However, when the wire 40 is disconnected from the lead 47 before the capillary 6 reaches the feed height as illustrated in FIG. 5D, the wire terminal and the lead 47 are in a non-conductive state (No in Step S22). No wire is protruded from the leading end of the capillary 6, and hence the error is set as the wire cut error. Further, as illustrated in FIG. 5E, the capillary 6 is raised to the spark height (Step S23). After that, the processing shifts to Step S12 illustrated in FIG. 2.

When the conductive state is achieved between the wire terminal and the lead 47 (Yes in Step S22), as illustrated in FIG. 5F, the capillary 6 is raised to the spark height (Step S24). When the capillary 6 is raised after the first clamp 7 is closed and the second clamp 8 is opened at the feed height, as illustrated in FIG. 5F, the wire 40 bonded to the lead 47 in the second bonding is cut off.

While the capillary 6 is raised from the feed height to the spark height, the wire 40 on the lead 47 is cut off, and thus the conductive state between the wire terminal and the lead 47 changes to the non-conductive state.

The capillary height obtained when the conductive state changes to the non-conductive state is read out from the Z-axis position counter 36, and the result is stored in the memory 32 (Step S25).

Next, when the capillary 6 reaches the spark height, the capillary height stored in the memory 32 in Step S25 is read out to verify whether or not the read capillary height is within an allowable value range set in advance (Step S26). When the capillary height stored in the memory 32 is outside of the allowable value range (No in Step S26), the error is set as a wire protrusion error (Step S27). After that, the processing shifts to Step S12 illustrated in FIG. 2.

Further, when the capillary height stored in the memory 32 is within the allowable value range (Yes in Step S26), discharge is performed between the discharge electrode 17 and the wire 40 when the capillary 6 reaches the spark height (Step S28). After the discharge, the processing shifts to Step S12 illustrated in FIG. 2.

As described above, the wire protrusion state detection operation is an operation in which, after the second bonding is ended, a current is applied between the wire terminal and the lead 47 to verify the conductive state between the wire and the lead, to thereby detect whether or not the wire is protruded by a predetermined length from the leading end of the capillary 6.

Further, the capillary height stored in the memory 32 in Step S25 is read out so that it is verified whether or not the read capillary height is within an allowable value range set in advance. Further, the discharge between the discharge electrode 17 and the wire 40 cannot be performed at a predetermined discharge voltage value or discharge current value when the amount of the wire protruding from the leading end of the capillary 6 fluctuates. Thus, the ball may not be formed, and hence the spark failure error or the like occurs. Through verification of those errors in Step S12 of FIG. 2, whether or not the wire is normally protruded from the leading end of the capillary 6 can be checked. In this manner, errors that have occurred before and after the discharge operation between the discharge electrode 17 and the wire can be detected.

Next, when the wire cut error, the wire protrusion error, the spark failure error, or other errors have occurred in Step S12 illustrated in FIG. 2, the wire protrusion operation described below is performed.

[Wire Protrusion Operation]

Now, with reference to the drawings, the wire protrusion operation in Step S13 of FIG. 2 is described with reference to FIG. 6 and FIG. 7A to FIG. 7F. FIG. 6 is a flow chart for illustrating the wire protrusion operation in the wire bonding. FIG. 7A to FIG. 7F are diagrams for illustrating operations of the capillary, the first clamp 7, and the second clamp 8 in the wire protrusion operation.

The wire protrusion operation is an operation of protruding the wire from the leading end 6a of the capillary 6 by the vibrating means under a state in which the wire is not normally protruded from the leading end 6a of the capillary 6 because the wire cut error, the spark failure error, or other errors have occurred during the bonding operation. With this operation, the wire can be automatically protruded from the leading end 6a of the capillary 6 without stopping the wire bonding apparatus, and thus the bonding can be continuously performed.

When the wire is not protruded from the leading end 6a of the capillary 6, the wire cut error, the spark failure error, or other errors have occurred, and thus the wire is not normally protruded from the leading end 6a of the capillary 6. This state corresponds to a state in which, for example, the leading end of the wire enters a through hole of the capillary 6 to be caught to an inner surface of the through hole of the capillary 6 to cause clogging, or the leading end of the wire is adhering to the leading end 6a of the capillary 6. Abnormality is caused in initial ball formation unless a tail length (protrusion amount of the wire from the leading end 6a of the capillary) has a necessary amount, and hence a predetermined length of wire is required to be protruded from the leading end 6a of the capillary 6.

In the following description of the wire protrusion operation, an operation after the second bonding is ended in the wire bonding is described.

As illustrated in FIG. 7A, when the spark failure error or other errors have occurred (Yes in Step S12 illustrated in FIG. 2), the wire is not protruded from the leading end 6a of the capillary 6. Therefore, the wire protrusion operation is performed so that the wire is protruded from the leading end 6a of the capillary 6. The capillary 6 is raised to the spark height.

In the wire protrusion operation, as illustrated in FIG. 7B, first, the capillary 6 is raised so that the capillary 6 is located as close as possible to the second clamp 8 side up to a position at which the wire is less liable to be buckled (Step S30 illustrated in FIG. 6). The amount to raise the capillary 6 is about several times as large as the amount corresponding to the wire protrusion amount. For example, when the wire protrusion amount is 500 micrometers (μm), the amount to raise the capillary 6 is 4 millimeters (mm).

As illustrated in FIG. 7C, in the wire protrusion operation, the second clamp 8 is subsequently closed, and the first clamp 7 is opened (Step S31).

Next, as illustrated in FIG. 7D, at the height of the capillary 6 at which the wire is less liable to be buckled, the vibrating means controls the linear motor 10 so as to apply the maximum acceleration to the bonding arm 4 and the ultrasonic horn 5. Thus, the vertical movement of the capillary 6 is repeated to obtain a force necessary for peeling off the wire adhering to the capillary 6 (Step S32). At this time, a natural frequency of the bonding arm 4 of the bonding head 3 is used for resonation, and thus the force necessary for peeling off the wire is amplified. The wire is protruded in this manner.

In this case, in Step S30, the capillary 6 is raised to the position at which the wire is less liable to be buckled in order to generate a restoring force in the wire so that the force necessary for peeling off the wire, which is generated by the vertical vibration of the capillary 6 by the vibrating means, is increased.

Further, in Step S32, the vertical movement of the capillary 6 is repeated, and at the same time as the vertical movement of the capillary 6, the capillary 6 is slightly raised so that the wire can be pushed out. The drive waveform of the capillary 6 at this time is illustrated in FIG. 7D. This operation is performed in order to progress the peeling off of the wire to reliably protrude the wire.

The frequency of the vertical movement of the capillary 6 is, for example, from 0.5 KHz to 1 KHz, and further the natural frequency of the bonding head 3 is from 1 KHz to 2 KHz. The vertical movement amount of the capillary 6 is roughly an operation amount of, for example, around 100 micrometers so that the leading end of the wire is prevented from exceeding a straight portion of the hole (through hole) in the capillary 6 to be located at a tapered portion on the capillary leading end side.

As described above, the vibrating means applies the maximum acceleration, which is not used during the apparatus operation, to the bonding arm 4 and the ultrasonic horn 5. Thus, a force necessary for peeling off the wire 40 adhering to the capillary 6 is obtained.

Further, as illustrated in FIG. 7D, vibrating the capillary 6 in the horizontal direction as indicated by the arrows by using the ultrasonic vibration to the capillary 6 at the same time as the vertical reciprocating operation of the capillary 6 is effective for facilitating the protrusion of the wire.

Next, it is checked whether or not a predetermined number of times of the vertical movement of the capillary 6 has been ended (Step S33). When the predetermined number of times of the vertical movement of the capillary 6 has not been ended (No in Step S33), the processing shifts to Step S32. When the number of times of the vertical movement of the capillary 6 reaches the predetermined number of times (Yes in Step S33), the vertical movement of the capillary 6 is stopped (Step S34). As illustrated in FIG. 7E, the wire is protruded from the leading end of the capillary by the vibrating means, and thus a tail is formed.

After that, as illustrated in FIG. 7F, the first clamp 7 is closed, and the second clamp 8 is opened (Step S35).

As described above, when it is determined that the wire is not protruded from the leading end of the capillary 6 during the bonding, the wire protrusion operation can be automatically performed without stopping the wire bonding apparatus.

Hitherto, after the wire bonding apparatus is stopped due to the abnormal state, for example, the wire cut error or the spark failure error, the operator protrudes the wire from the capillary 6 and performs dummy bonding (denting) to ensure a wire length that is necessary for forming a ball. Then, a ball is formed, and the wire bonding apparatus is restored to a normal state. Thus, a time has been required for restoring the wire bonding apparatus.

[Wire Protrusion Amount Measurement Operation]

Next, the wire protrusion amount measurement operation of measuring whether or not the wire is protruded by a predetermined length from the leading end of the capillary due to the wire protrusion operation illustrated in Step S14 of FIG. 2 or the like is described with reference to FIG. 8 and FIG. 9.

Figure 8:
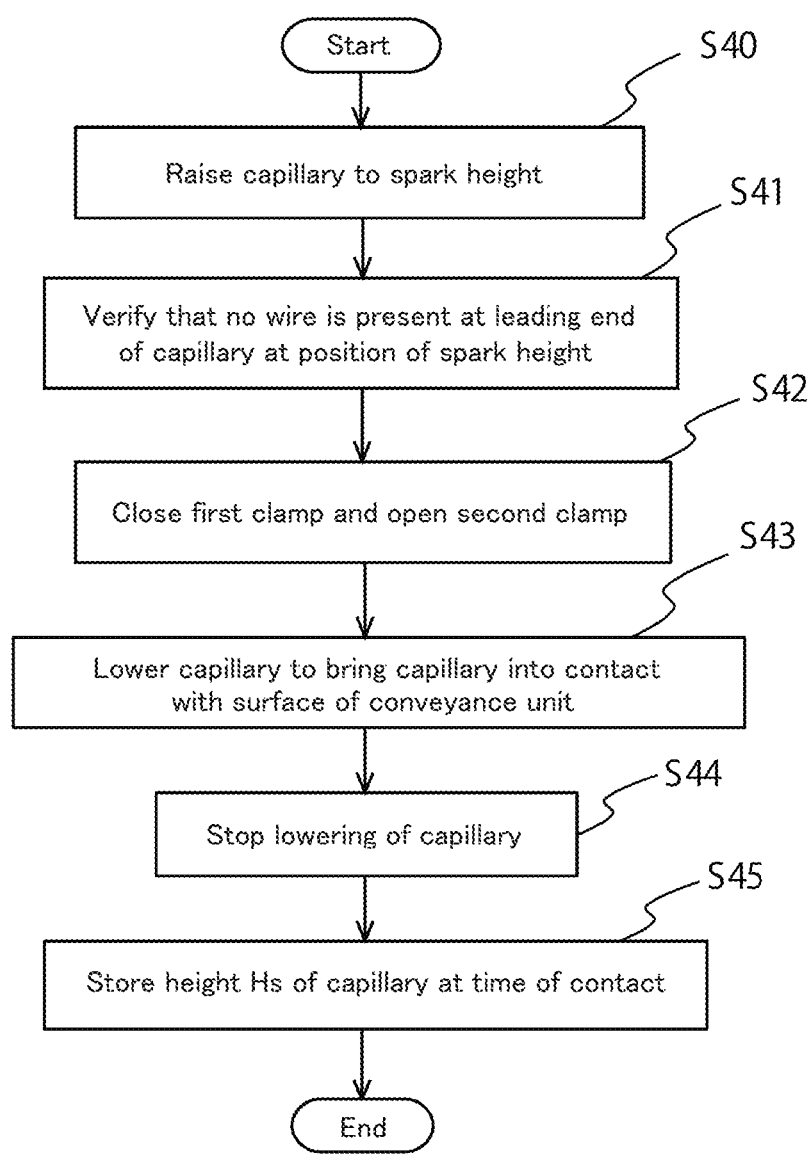
FIG. 8 is a flow chart of an operation of measuring a reference value to be used for wire protrusion amount measurement at a leading end of the capillary on a surface of a workpiece conveyance unit.

FIG. 8 is a flow chart of an operation of measuring a reference value to be used for the wire protrusion amount measurement at the leading end of the capillary 6 on a surface of the workpiece conveyance unit. FIG. 9 is a flow chart of the wire protrusion amount measurement operation of measuring whether or not the wire is protruded by a predetermined length from the leading end of the capillary.

First, description is given of measurement of the reference value on the surface of the workpiece conveyance unit, which is used for the wire protrusion amount measurement at the leading end of the capillary 6. The measurement of the reference value for the wire protrusion amount measurement is normally performed only once, and then the measured value is stored in the memory 32 as the reference value. However, when the capillary 6 is replaced or the measurement location of the surface of the workpiece conveyance unit is changed, the measurement is performed again.

The location of the workpiece conveyance unit to be used in the wire protrusion amount measurement is desired to be a fixed position that is unmovable, and a portion that is insusceptible to heat of a heater.

As illustrated in FIG. 8, in the measurement of the reference value for the wire protrusion amount measurement, the capillary 6 is raised to the spark height (Step S40). The position of the spark height is set in advance.

At this time, it is verified that no wire is present at the leading end of the capillary 6. When the wire is protruded from the leading end of the capillary 6, a state in which no wire is present at the leading end of the capillary 6 is obtained (Step S41). For example, the feeding motor 14 configured to perform the feed-out operation of the wire from the wire spool 13 illustrated in FIG. 1 is rotated by about ¼ in the reverse direction to wind the wire so that the state in which no wire is present at the leading end of the capillary 6 is obtained. Further, the first clamp 7 may be opened and the capillary 6 may be lowered so that the wire at the leading end of the capillary 6 may be pulled inside the capillary.

After that, the first clamp 7 is closed, and the second clamp 8 is opened (Step S42). The capillary 6 is lowered to bring the capillary 6 into contact with a predetermined position of the surface of the workpiece conveyance unit (Step S43). After the leading end of the capillary 6 is brought into contact with the surface of the workpiece conveyance unit, the lowering of the capillary 6 is stopped (Step S44).

The lowering of the capillary 6 is stopped after, for example, the pulse generation circuit 35 or the Z-axis position counter 36 detects that the capillary 6 being lowered at a constant speed V1 is brought into contact with the surface of the workpiece conveyance unit and thus the speed V1 is changed to a speed V2 (speed of 0).

Under a state in which the capillary 6 is brought into contact with the workpiece conveyance unit and stopped, data is read out from the Z-axis position counter 36, and the read data is stored in the memory 32 as a reference value Hs (Step S45). With the above-mentioned operation, the reference value for the wire protrusion amount measurement is measured and stored in the memory 32.

Figure 9:
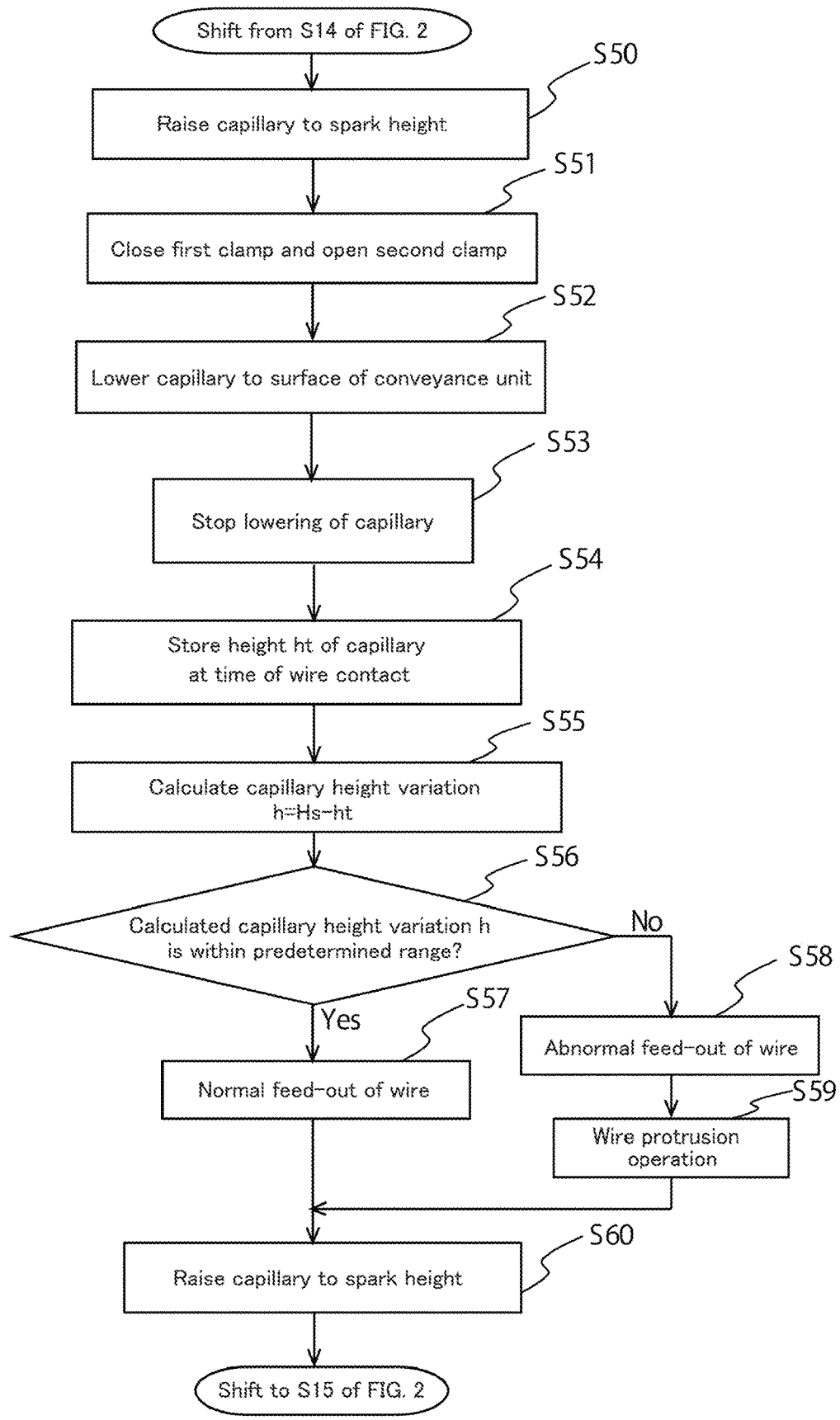
FIG. 9 is a flowchart of a wire protrusion amount measurement operation of measuring whether or not the wire is protruded by a predetermined length from the leading end of the capillary.

Next, with reference to FIG. 9, description is given of the wire protrusion amount measurement operation of performing processing of determining whether or not the wire is normally protruded from the leading end of the capillary 6 due to the wire protrusion operation. The wire protrusion amount measurement operation is an operation illustrated in Step S14 of FIG. 2.

As illustrated in FIG. 9, first, the capillary 6 is lowered or raised so that the capillary 6 is positioned to the spark height (Step S50). After that, the first clamp 7 is closed, and the second clamp 8 is opened (Step S51).

The capillary 6 is lowered to bring the wire at the leading end of the capillary 6 into contact with a predetermined location (position) of the surface of the workpiece conveyance unit (Step S52). After the wire at the leading end of the capillary 6 is brought into contact with the surface of the workpiece conveyance unit, the lowering of the capillary 6 is stopped (Step S53). At this time, the conductive state verification circuit may check whether or not conduction is achieved between the wire terminal and the surface of the workpiece conveyance unit through intermediation of the wire.

Under the state in which the capillary 6 is brought into contact with the workpiece conveyance unit and stopped, data is read out from the Z-axis position counter 36, and the read data is stored in the memory 32 as a capillary height ht (Step S54).

At this time, the reference value Hs measured and stored in advance is read out, and a capillary height variation h=Hs-ht is calculated (Step S55). The capillary height variation h corresponds to the length of the wire protruding from the leading end of the capillary 6.

It is determined whether or not the calculated capillary height variation h is within a predetermined range (Step S56).

When the calculated capillary height variation h is within the predetermined range (Yes in Step S56), it is determined that the wire is normally protruded (Step S57). After that, the capillary 6 is raised to the spark height (Step S60), and the processing shifts to Step S15 of FIG. 2.

On the other hand, when the calculated capillary height variation h is out of the predetermined range (No in Step S56), it is determined that the wire is abnormally protruded (Step S58), and the wire protrusion operation is performed again (Step S59). After that, the capillary 6 is raised to the spark height (Step S60), and the processing shifts to Step S15 of FIG. 2.

As described above, the wire bonding apparatus of the present invention can determine whether or not the wire is normally protruded from the leading end of the capillary 6 based on the length of the wire protruding from the leading end of the capillary 6.

As described above, the wire bonding apparatus of the present invention performs any one of the conduction check between the wire terminal and the lead 47, the check based on the discharge, and the check of the capillary height in the normal operation after the second bonding in the bonding, to thereby verify whether or not the wire is normally protruded from the leading end of the capillary 6 before and after the sparking (discharge between the discharge electrode and the wire). Therefore, the wire protrusion from the leading end of the capillary 6 can be detected without affecting the bonding operation.

In this manner, the feeding operation of the wire is performed only when a predetermined length of wire (tail) is absent at the leading end of the capillary 6, and hence reduction in bonding tact can be suppressed to the minimum.

The operation during the bonding has been described above, but in the wire bonding apparatus, the wire protrusion may be inhibited when deposited matters adhere to the surface of the leading end of the capillary during the bonding. Therefore, the capillary is required to be cleaned after the bonding is performed a predetermined number of times.

[Capillary Cleaning Operation]

Figure 10:
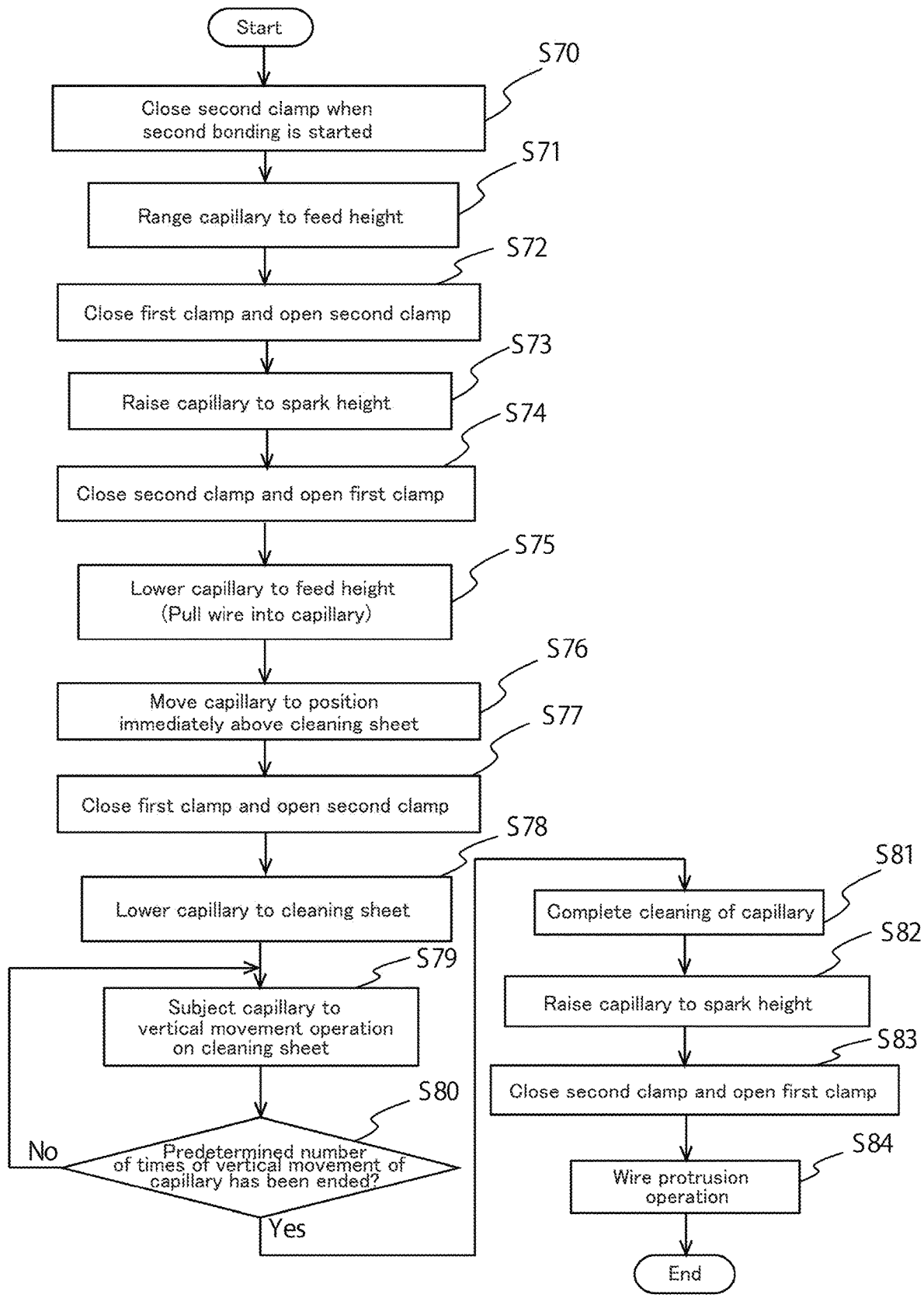
FIG. 10 is a flowchart for illustrating a capillary cleaning operation.
Figure 11A:
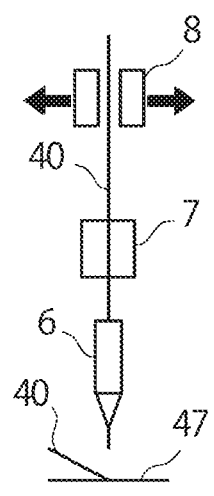
FIG. 11A, FIG. 11B, and FIG. 11C are diagrams for illustrating operations of the capillary, the first clamp, and the second clamp in the capillary cleaning operation.
Figure 11B:
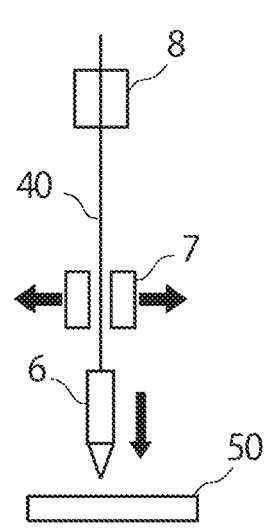
Figure 11C:
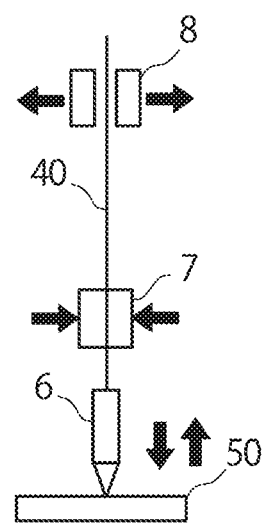

Next, the capillary cleaning operation is described with reference to FIG. 10 and FIG. 11A to FIG. 11C. FIG. 10 is a flow chart for illustrating the capillary cleaning operation. FIG. 11A to FIG. 11C are diagrams for illustrating operations of the capillary, the first clamp, and the second clamp in the capillary cleaning operation.

The capillary 6 is cleaned as follows. A vertical operation through a high-speed movement of the ultrasonic horn is performed to hit the capillary onto a cleaning sheet. Thus, such a force (impact force) as to peel off the deposited matters on a face surface of the capillary 6 is generated so that the dirt on the inside and the outer periphery in the vicinity of the leading end of the capillary 6 is removed.

First, as illustrated in FIG. 10, when the second bonding is started, the second clamp 8 is closed (Step S70). After that, the capillary 6 is raised to the feed height (Step S71). When the capillary 6 reaches the feed height, the first clamp 7 is closed, and the second clamp 8 is opened (Step S72). After that, the capillary 6 is raised to the spark height (Step S73). As illustrated in FIG. 11A, when the capillary 6 is positioned at the spark height, the first clamp 7 is in a closed state, and the second clamp 8 is in an opened state.

In the normal bonding, after the capillary reaches the spark height, discharge is performed to form a ball at the leading end of the capillary, but in the cleaning operation, as illustrated in FIG. 11B, the second clamp 8 is closed and the first clamp 7 is opened without performing the discharge (Step S74). After that, an operation of pulling the wire into the capillary is performed.

The operation of pulling the wire into the capillary is performed as follows. The capillary 6 is lowered to the feed height so that the wire protruded from the leading end of the capillary 6 is pulled into the capillary (Step S75). At this time, a state in which no wire is present at the leading end of the capillary 6 is obtained. After that, the bonding head 3 is moved by the XY stage 18 so that the capillary 6 is positioned immediately above a cleaning sheet 50 (Step S76).

As illustrated in FIG. 11C, after the operation of pulling the wire into the capillary is performed, the first clamp 7 is closed, and the second clamp 8 is opened (Step S77).

The capillary 6 is lowered so as to bring the capillary 6 into contact with a surface of the cleaning sheet 50 provided on the workpiece conveyance unit. After the leading end of the capillary 6 is brought into contact with the surface of the cleaning sheet 50, the lowering of the capillary 6 is stopped (Step S78).

The cleaning sheet 50 is obtained by forming an abrasive layer made of an abrasive on a cushioning layer having protrusions.

After the operation of lowering the capillary 6 is stopped, the vertical movement of the capillary 6 is repeated (Step S79). The frequency of the vertical movement of the capillary 6 is, for example, from 0.5 KHz to 1 KHz, and an amount of the vertical movement of the capillary 6 is several tens of micrometers. In this manner, the capillary 6 is vertically moved at high speed so that the leading end of the capillary 6 repeatedly abuts against (hits) the cleaning sheet 50. Thus, an impact force is generated.

The cleaning sheet 50 having protrusions enables the abrasive on the surface of the cleaning sheet 50 to enter the deeper side of the capillary 6 due to the vertical operation of the capillary 6.

Whether or not a predetermined number of times of the vertical movement of the capillary 6 has been ended is checked (Step S80). When the predetermined number of times of the vertical movement of the capillary 6 has not been ended (No in Step S80), the processing shifts to Step S79. When the number of times of the vertical movement of the capillary 6 reaches the predetermined number of times (Yes in Step S80), the capillary cleaning is completed, and the vertical movement of the capillary 6 is stopped (Step S81).

Next, the capillary 6 is raised to the spark height (Step S82). After that, the second clamp 8 is closed, and the first clamp 7 is opened (Step S83). Then, the wire protrusion operation illustrated in FIG. 6 is performed so that the wire is protruded from the leading end of the capillary 6 (Step S84). After the wire is protruded, the first clamp 7 is closed, and the second clamp 8 is opened.

With this, the dirt on the surface and the inside of the capillary 6 can be caused to adhere to the abrasive layer of the cleaning sheet 50. The cleaning sheet 50 includes a cushioning layer, and hence the cleaning can be effectively performed without damaging the capillary 6 even when the capillary 6 is vertically operated.

The related-art ultrasonic application operation or horizontal operation like the XY-stage movement may have difficulty in obtaining high cleaning performance because the friction between the capillary 6 and the polishing material may be small when the surface of the cleaning sheet is made of a soft material.

In the wire bonding apparatus of the present invention, the irregularities of the cleaning sheet easily enter the inside of the capillary 6 due to the vertical operation of the capillary 6, and thus the friction with the polishing material is increased. Thus, the wire bonding apparatus of the present invention can remove even a foreign matter inside the hole (through hole) of the capillary 6.

As described above, according to the present invention, hitherto, when errors such as the wire cut error occur after the second bonding, the wire bonding apparatus is stopped, and the operator is required to carry out the work of inserting the wire through the capillary again. The wire bonding apparatus of the present invention includes the vibrating means for vertically vibrating the capillary, and determines whether or not the wire is protruded from the leading end of the capillary while the capillary is raised after the second bonding. When it is determined that the wire is not protruded from the leading end of the capillary, the vibrating means causes the wire to protrude from the leading end of the capillary.

In this manner, even under the state in which the wire adheres to the leading end of the capillary during the bonding, or the wire is caught to the inside of the capillary, the wire can be automatically protruded from the leading end of the capillary without stopping the wire bonding apparatus. Therefore, the operating rate of the wire bonding apparatus can be improved.

Further, according to the present invention, whether or not a predetermined length of wire is protruded from the leading end of the capillary can be automatically detected before or after the wire is protruded, and hence the operation of checking the wire protrusion by the operator is unnecessary.

Further, hitherto, when the apparatus is started up or when the wire cut error occurs, after the wire is inserted through the capillary, the wire is required to be protruded from the leading end of the capillary by a length necessary for forming a ball. At this time, a capillary dent is formed once or twice on a bonding workpiece so that the wire is cut and a necessary amount of a tail is ensured. Therefore, the wire remaining on the workpiece is required to be removed.

After the wire is inserted through the capillary and the wire is cut at the leading end of the capillary, in the wire bonding apparatus of the present invention, the wire can be automatically protruded from the leading end of the capillary. Therefore, the wire can be easily protruded without forming an unnecessary dent on the bonding workpiece. Further, the wire bonding apparatus can be operated with a minimum wire consumption amount.

Further, in the wire bonding apparatus, deposited matters adhere to the surface of the leading end of the capillary during the bonding, and thus the protrusion of the wire is inhibited. Therefore, cleaning of the capillary is required. The wire bonding apparatus of the present invention cleans the capillary by vertically moving the leading end of the capillary at high speed so that the leading end repeatedly abuts against the surface of the cleaning sheet having an adhesive property. In this manner, the deposited matters on the leading end of the capillary and the dirt adhering to the inside of the capillary can be peeled off. Therefore, after the capillary is cleaned, the wire can be smoothly protruded.

Further, cleaning the leading end of the capillary enables the usage period of the capillary to be extended. Further, the number of times of replacement of the capillary can be reduced, and hence the time required for the replacement of the capillary can be reduced. Thus, the operating rate of the wire bonding apparatus can be improved, and the cost of the bonding components can be reduced.

Further, in the present invention, the capillary cleaning and the protrusion (wire tail formation) operation of the wire at the leading end of the capillary are automatically performed, and thus the wire bonding apparatus can be operated without a stop. Therefore, the continuous operating time may be significantly improved.

The present invention can be embodied in a large number of forms without departing from the essential characteristics thereof. Thus, the above-mentioned embodiment is exclusive for description, and it is to be understood that the present invention is not limited to the above-mentioned embodiment.

What is claimed is:

1. A wire bonding method, comprising:
vertically vibrating a bonding arm at a natural frequency of the bonding arm under a state in which holding means provided above a capillary holds a wire inserted through a through hole of the capillary so that the wire is protruded from a leading end of the capillary,
wherein the bonding arm comprises an ultrasonic horn, and
the ultrasonic horn has a leading end to which the capillary is mounted.

2. The wire bonding method according to claim 1, wherein the capillary is vertically vibrated after the capillary is moved for a predetermined distance to approach the holding means.

3. The wire bonding method according to claim 1, further comprising applying ultrasonic vibration to the capillary by the ultrasonic horn,
wherein the ultrasonic vibration is superimposed to the capillary when the capillary is vertically vibrated.

4. The wire bonding method according to claim 1, further comprising performing cleaning of removing dirt adhering to the leading end of the capillary by vertically vibrating the capillary so that the leading end of the capillary repeatedly abuts against a surface of a cleaning sheet having an adhesive property.

5. A wire bonding method, comprising:
holding a wire inserted through a through hole of a capillary by holding means provided above the capillary,
vertically vibrating a bonding arm, which comprises an ultrasonic horn having a leading end to which the capillary is mounted, at a natural frequency of the bonding arm, and
protruding the wire from a leading end of the capillary.

6. The wire bonding method according to claim 5, wherein the capillary is vertically vibrated after the capillary is moved for a predetermined distance to approach the holding means.

7. The wire bonding method according to claim 5, further comprising applying ultrasonic vibration to the capillary by the ultrasonic horn,
wherein the ultrasonic vibration is superimposed to the capillary when the capillary is vertically vibrated.

8. The wire bonding method according to claim 5, further comprising performing cleaning of removing dirt adhering to the leading end of the capillary by vertically vibrating the capillary so that the leading end of the capillary repeatedly abuts against a surface of a cleaning sheet having an adhesive property.

* * * * *